(12) United States Patent
VanBlon et al.

(10) Patent No.: US 9,400,572 B2
(45) Date of Patent: Jul. 26, 2016

(54) SYSTEM AND METHOD TO ASSIST REACHING SCREEN CONTENT

(71) Applicant: Lenovo (Singapore) Pte. Ltd., Singapore (SG)

(72) Inventors: Russell Speight VanBlon, Raleigh, NC (US); Neal Robert Caliendo, Jr., Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 99 days.

(21) Appl. No.: 14/094,427

(22) Filed: Dec. 2, 2013

(65) Prior Publication Data

US 2015/0153889 A1    Jun. 4, 2015

(51) Int. Cl.
*G06F 3/048*    (2013.01)
*G06F 3/0488*   (2013.01)
*G06F 3/041*    (2006.01)

(52) U.S. Cl.
CPC .................... *G06F 3/0416* (2013.01)

(58) Field of Classification Search
CPC .............. G06F 3/04845; G06F 3/0485; G06F 3/04855; G06F 2203/04808; G06F 3/0416; G06F 3/0488

USPC .................................................. 715/700–866
See application file for complete search history.

(56) References Cited

U.S. PATENT DOCUMENTS

| 8,769,431 B1 * | 7/2014 | Prasad .................... G06F 3/048 715/764 |
| 2006/0197750 A1 * | 9/2006 | Kerr et al. ...................... 345/173 |
| 2008/0046836 A1 * | 2/2008 | Maruyama et al. ............ 715/784 |
| 2011/0164063 A1 * | 7/2011 | Shimotani et al. ............ 345/661 |
| 2014/0204063 A1 * | 7/2014 | Kaida ..................... G06F 1/169 345/184 |

FOREIGN PATENT DOCUMENTS

WO    WO2013035229 A1 *  3/2013

* cited by examiner

*Primary Examiner* — Kumar Patel
*Assistant Examiner* — Amy C Onyekaba
(74) *Attorney, Agent, or Firm* — Schwegman, Lundberg & Woessner, P.A.

(57) ABSTRACT

A device and method include detecting a position of a finger positioned proximate a touch screen of a hand held device, the touch screen having a target available for selection via the finger, comparing the detected position of the finger to a selection range, and moving a target on the touch screen responsive to the comparison.

16 Claims, 4 Drawing Sheets

SYSTEM AND METHOD TO ASSIST REACHING SCREEN CONTENT

BACKGROUND

On some touch devices, content can often be out of reach or require a lot of physical movement to touch. Some touch devices enable a user to physically touch screen and drag finger in a scroll gesture movement. Other devices provide varying abilities to reach the content, including allowing a user to tilt screen in direction of intended scrolling, or watching a user's eye movements and scrolling screen accordingly. Some users may modify how they hold the device, but this makes dropping the device more likely. The user can also use two hands to interact with the device, but this can be inconvenient for the user. Some of these methods only work if an app/content supports scrolling.

SUMMARY

A method includes detecting a position of a finger positioned proximate a touch screen of a hand held device, the touch screen having a target available for selection via the finger, comparing the detected position of the finger to a selection range, and moving a target on the touch screen responsive to the comparison.

A computer readable storage device has stored instructions to cause a computer processor to execute a method. The method includes detecting a position of a finger positioned proximate a touch screen of a hand held device, the touch screen having a target available for selection via the finger, comparing the detected position of the finger to a selection range, and moving a target on the touch screen responsive to the comparison.

A hand held device includes a case, a storage device disposed within the case, a touch screen supported by the case, finger proximity sensors coupled to the case, and a processor coupled to the storage device, the proximity sensors, and the touch screen, the processor receiving instructions from the storage device to cause the processor to execute a method. The method includes detecting a position of a finger positioned proximate a touch screen of a hand held device, the touch screen having a target available for selection via the finger, comparing the detected position of the finger to a selection range, and moving a target on the touch screen responsive to the comparison.

DETAILED DESCRIPTION

Figure 1:
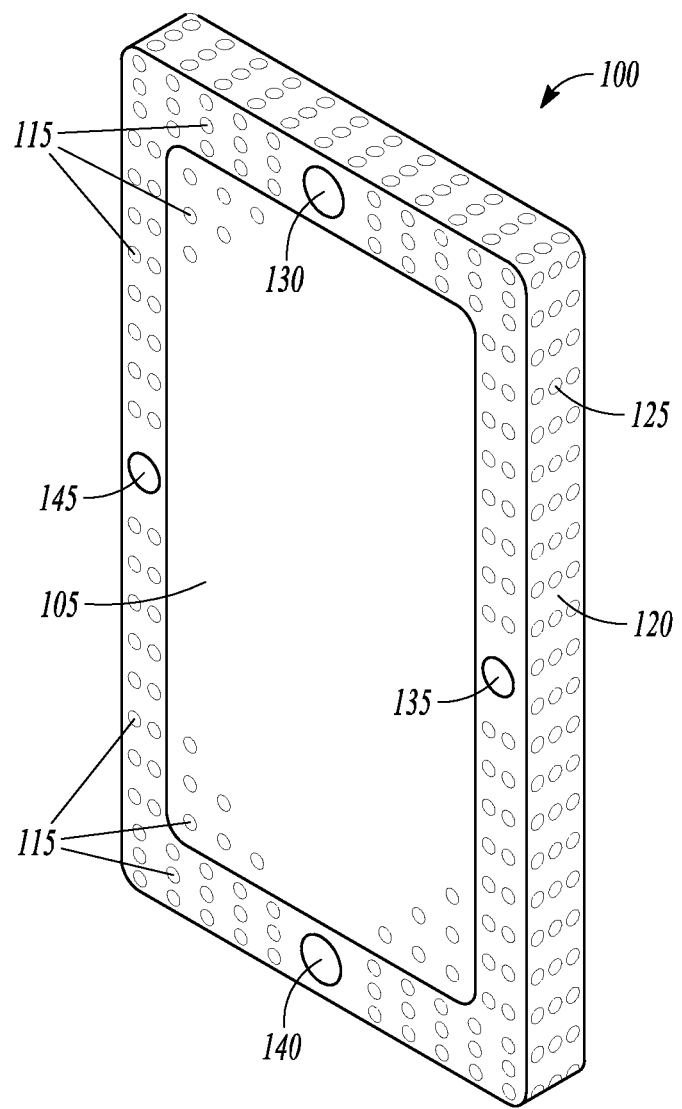
FIG. 1 is a perspective view of a hand held device having multiple sensors according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media such as memory or other type of storage devices. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

Content on a touch screen is moved responsive to detection of a user of a system is attempting to reach the content. The system's screen, sensors and/or camera may be used to learn a user's range of motion and detect when the user is attempting to reach content beyond a normal reach of the user. In one example, when a user utilizes a finger to touch the screen and reach a target such as an icon or other content, the device can detect when the thumb is outstretched as far as possible. When this occurs, the system will automatically scroll the screen towards the direction the user's finger is reaching to enable the user to easily touch the intended target. The direction the finger is reaching may be used to determine what content is moved towards the user. The system may move content as the user's finger is extended and "meet the user" when their finger is at a comfortable position to make a touch selection.

If multiple piece of content are out of reach, the entire screen content may shift/scroll so the user can reach potential targets without reaching beyond a normal or comfortable range. If a small number of potential touch targets can be identified, the target(s) may be moved within the user's reach while leaving the other screen content in place. If any target overlap occurs, the target moved by the system would take priority and be drawn on top of other targets, or other targets may be made transparent or invisible.

The user could cancel a screen shift by selecting a target or ceasing to reach their finger in the direction. If a target is used frequently that is located outside the user's typical reach, the target could be automatically moved within the user's reach. If no destination real estate exists for the frequently used target to be moved, it may be swapped with the least frequently used target or a target that may be identified as less important to the user. The system may also prompt the user for a target to swap with.

For scrollable content, reaching the finger may not shift potential targets, but instead may cause scrolling all the content to what the user is reaching for.

FIG. 1 is a perspective view of a hand held device 100, such a mobile phone having pressure sensing circuits (e.g. resistive and capacitive sensors), piezoelectric materials or other pressure-sensing solutions are embedded in or layered on top of a handheld device like a smartphone, smart watch or other hand held electronic device. The sensing technology may be positioned within the housing such that one or more sides of the device, including a touch screen 105 side have pressing sensing capability and proximity sensing capability to indicate position of a finger reaching for content displayed on the touchscreen 105.

In various embodiments, the term finger may also include an arm, pen or pointing device, knuckle, hand, and other body parts or objects. A user may be reaching over a table-top personal computer, in which case, their arm would be detected. A pen may be detected in a user's hand, or if a hand is dirty, the user may use a knuckle to make a selection. Contact mechanics applied to the device may also be detected. As a result, the sensing capability can detect fully where a user's fingers and hand are gripping the device 100.

Device 100 may also have pressure sensing capability on left and right sides, and rear a housing 110. An array of sensors 115, such as resistive and/or capacitive sensors, are represented as dots covering the device 100. The use of capacitive based sensors allows proximity detection of fingers positioned over the touch screen 105, allowing detection of a user reaching for a target in displayed content. Note that while only a few sensors 115 are shown on screen 105 for an uncluttered view, the entire surface of screen 105 may be covered by sensors to enable detection. The target may be a link or icon, or other user selectable element. In one embodiment, the housing 110 is the case of the hand held device supporting interior electronics, buttons, and touch screen on a front side of the device 100 not visible in FIG. 1. In further embodiments, the housing may take the form of an external case that is shaped to hold the device 100 and connect via one or more electrical connectors.

A side 120 of the housing 110 corresponds to an edge of the housing 110, and may also have sensors 125 embedded, layers on top of, or otherwise disposed on the side 120. Sensors 125 may also be similarly disposed on other sides of the housing 110. The sensors 115 and 125 may have pressing sensing capability to indicate contact mechanics applied to the device 100. As a result, this sensing capability can detect fully where a user's fingers and hand are gripping the device.

In one embodiment, a camera 130 may be disposed on a front of the device 100 containing the touch screen 105, allowing the detection of where fingers are positioned within a wide angle view of the camera. Multiple cameras 135, 140, 145 may be used in further embodiments and positioned near the sides and bottom of the device outside the touchscreen 105, or alternatively within the touchscreen area in further embodiments. Thus, finger position attempting to reach a target on the touch screen 105 may be detected using cameras, the proximity sensors, or a combination of both.

Figure 2:
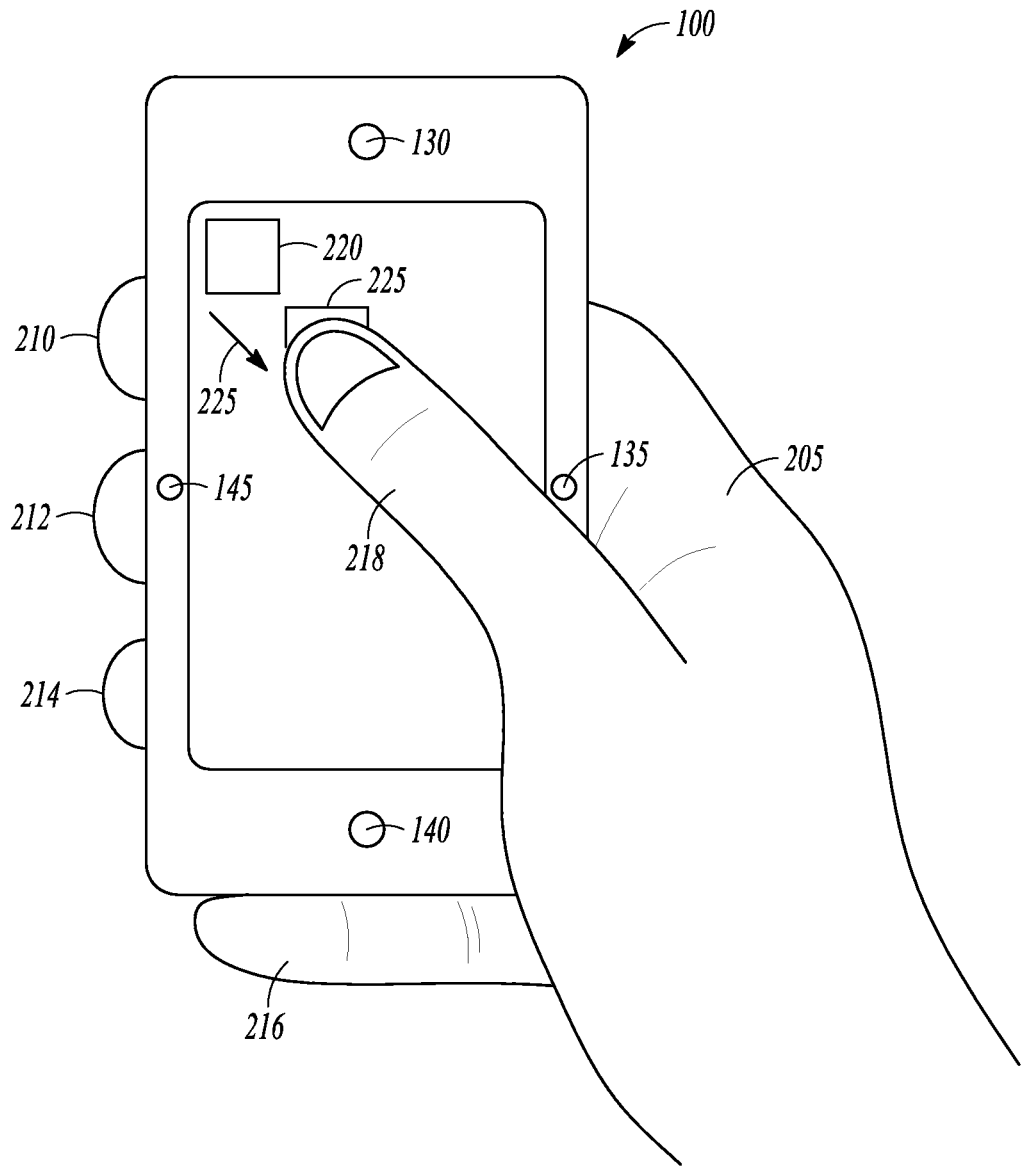
FIG. 2 is a representation of a hand held device being held by a user according to an example embodiment.

FIG. 2 is a diagram illustrating a user's hand 205 holding device 100 with fingers 210, 212, and 214 on one side of the device 100, little finger 216 supporting a bottom side of the device 100, and a fifth finger, thumb 218 reaching for a target 220 located in a position on the display 105 that is difficult to reach while maintaining the illustrated grip of the device. The sensors are not shown in this diagram to more clearly indicate the target 220 and reaching thumb 218.

The cameras 130 and 145 in this embodiment are closest to the target 220 and may be used to detect that the thumb 218 has extended beyond a range normally associated with the grip on the system 100. The system 100 recognizes that the user is reaching toward the target 220 and moves the target toward the thumb 218 as indicated by arrow 225 to a position where the thumb can select the target as indicated at 230. The amount of movement may be varied, and may include moving the target to a position within the normal reach of the thumb, which may be further in the direction indicated by arrow 225.

There are several alternative ways to determine whether a finger is being moved outside a range normally associated with the grip. In one embodiment, the system 100 may keep statistics regarding ranges in which the thumb, or for that matter another finger used by the user when holding the system 100 in a different manner, and then note movement outside the normal range.

In further embodiments, a shift in grip pressure may be correlated with movement outside the normal range of movement. Such shift or change in grip pressure of one or more fingers or other parts of the hand contacting the system 100 may be associated with difficulty reaching a target, causing the target to be moved toward a finger being used to select targets or otherwise interact with the screen.

A border may be established corresponding to an area either by recording the normal movements and calculating the area based on a percentage of the normal range, or the user can be asked to move a selected finger within a comfortable range during a training period. That comfortable range may be detected, stored on computer readable storage, and then used to compare to a finger's position. If the finger is detected as beyond the comfortable range, one or more potential targets in the general direction of the finger may be moved closer to the finger and within the comfortable range.

In further embodiments, the comfortable range may be correlated with the grip on the system 100. Each different grip may have a different comfortable range in some embodiments, with each range being either detected through normal use of the system 100 or trained during a training period. Some grips, such as a two handed grip may either set the comfortable range to cover the entire screen, resulting in targets not being moved. Such grips may alternatively result in target moving being disabled.

In still further embodiments, the target may consist of the content being viewed on a mobile device. The content may be a document, picture, graphics, or a combination of the above that may be larger than will fit in a viewable manner on the screen. As the user reaches with a finger, the content may scroll within the screen. The scrolling direction may be toward the direction that the finger is reaching when near, at, or beyond the comfortable range. The scrolling may be enabled in certain contexts, like viewing maps or large pictures that have been zoomed in and now form an image larger than the screen.

Figure 3:
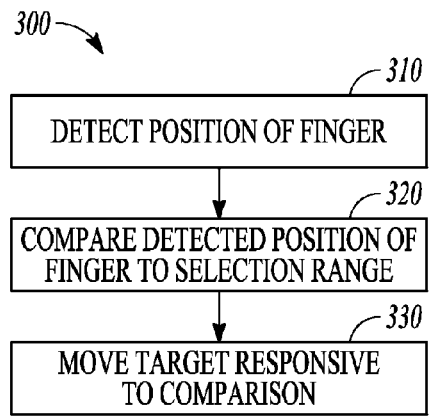
FIG. 3 is a flowchart illustrating a method of authenticating a user based on a contact signature derived from a hand held device according to an example embodiment.

FIG. 3 is a flowchart illustrating a method 300 of moving targets responsive to a user's interaction with a device with a touch screen. The method 300 in one embodiment begins at 310 by detecting a position of a finger positioned proximate the touch screen of the device, the touch screen having at least one, and optionally multiple targets available for selection via the finger. The finger position may be detected via camera, capacitive sensors, and pressure sensors in various embodiments. The finger position proximate the touch screen includes a finger position touching the touch screen and a finger position above the touch screen corresponding to a user using the finger to reach for a target.

At 320, the detected position of the finger is compared to a selection range. At 330, a target, such as a user selectable icon, on the touch screen is moved responsive to the comparison. The target may be moved within the selection range, which may correspond to a range that is comfortable for a user to move their finger within. In one embodiment, multiple targets are moved within the selection range.

Figure 4:
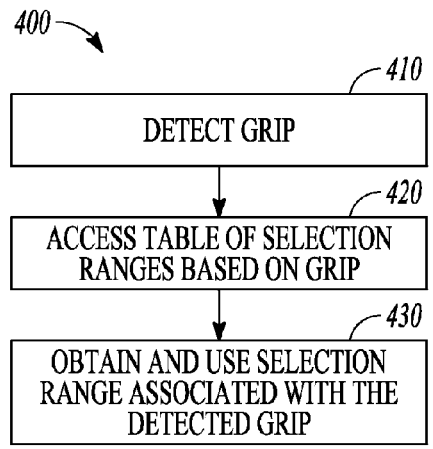
FIG. 4 is a flowchart illustrating a method of associating a selection range with a grip according to an example embodiment.

In some embodiments, the selection range is associated with a particular grip as illustrated in method 400 in flowchart form in FIG. 4. The grip may be detected at 410 and provided a grip identifier. The grip identifier may then be used to access a table of selection ranges at 420. The selection range associated with the grip identifier is then obtained 430 from the table and used to determine when to move a target or targets.

Figure 5:
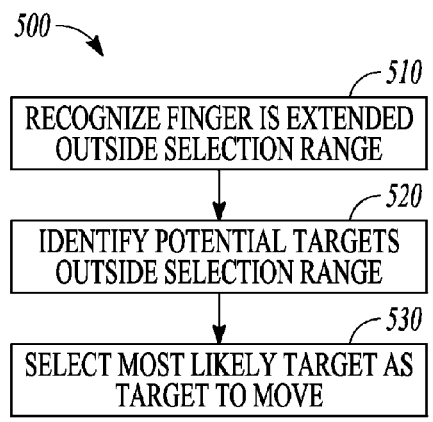
FIG. 5 is a flowchart illustrating a method of identifying targets to move according to an example embodiment.

FIG. 5 is a flowchart of a method 500 of moving the target. At 510, the system recognizes that a finger is extending beyond the selection range based on the comparison. Potential targets outside the selection range in a direction extending from a center of the selection range towards the detected position of the finger are identified at 520. At 530, a most likely target is selected from the identified potential targets and moved from outside the selection range to inside the selection range along the direction used to identify potential targets. In some embodiments, multiple identified potential targets are moved. The most likely target may be a target most often selected from the identified potential targets.

Figure 6:
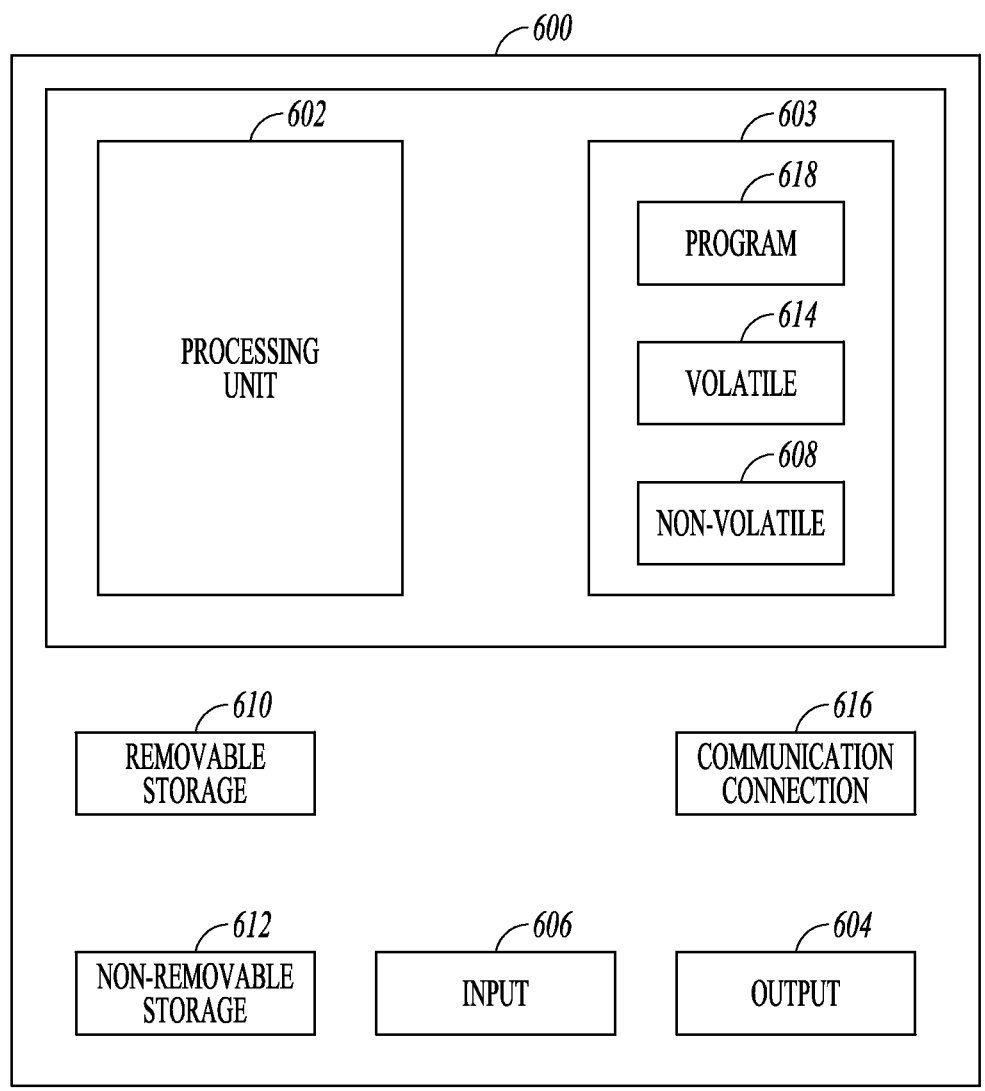
FIG. 6 is a block diagram of computer system used to implement methods according to an example embodiment.

FIG. 6 is a block schematic diagram of a computer system 600 to implement a controller according to an example embodiment. In one embodiment, multiple such computer systems are utilized in a distributed network to implement multiple components in a transaction based environment. An object-oriented, service-oriented, or other architecture may be used to implement such functions and communicate between the multiple systems and components. One example computing device in the form of a computer 600, may include a processing unit 602, memory 603, removable storage 610, and non-removable storage 612. Memory 603 may include volatile memory 614 and non-volatile memory 608. Computer 600 may include—or have access to a computing environment that includes—a variety of computer-readable media, such as volatile memory 614 and non-volatile memory 608, removable storage 610 and non-removable storage 612. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 600 may include or have access to a computing environment that includes input 606, output 604, and a communication connection 616. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 602 of the computer 600. A hard drive, CD-ROM, and RAM are some examples of articles including a non-transitory computer-readable medium. For example, a computer program 618 capable of providing a generic technique to perform access control check for data access and/or for doing an operation on one of the servers in a component object model (COM) based system may be included on a CD-ROM and loaded from the CD-ROM to a hard drive. The computer-readable instructions allow computer 600 to provide generic access controls in a COM based computer network system having multiple users and servers.

Examples

1. A method comprising:
detecting a position of a finger positioned proximate a touch screen of a hand held device, the touch screen having a target available for selection via the finger;
comparing the detected position of the finger to a selection range; and
moving a target on the touch screen responsive to the comparison.

2. The method of example 1 wherein the target is moved within the selection range.

3. The method of any of examples 1-2 wherein the selection range is a range corresponding to a range that is comfortable for a user to move their finger within.

4. The method of any of examples 1-3 and further comprising detecting a grip of the hand held device, and wherein the selection range is associated with the grip.

5. The method of example 4 and further comprising selecting the selection range based on the detected grip.

6. The method of any of examples 1-5 wherein multiple targets are available for selection and are moved within the selection range.

7. The method of any of examples 1-6 wherein moving the target on the touch screen comprises:
recognizing that a finger is extending beyond the selection range based on the comparison;
identifying potential targets outside the selection range in a direction extending from a center of the selection range towards the detected position of the finger; and
moving a most likely target from the identified potential targets from outside the selection range to inside the selection range along the direction used to identify potential targets.

8. The method of example 7 and further comprising moving multiple identified potential targets.

9. The method of example 7 wherein the most likely target comprises a target most often selected from the identified potential targets.

10. The method of any of examples 1-9 wherein the finger position is detected via capacitive sensors in the touch screen.

11. The method of any of examples 1-10 wherein the finger position is detected via cameras.

12. The method of any of examples 1-11 wherein the finger position is detected via pressure sensors.

13. The method of any of examples 1-12 wherein the finger position proximate the touch screen includes finger position touching the touch screen and finger position above the touch screen corresponding to a user using the finger to reach a target.

14. The method of any of examples 1-13 wherein the target comprises a user selectable icon.

15. A machine readable storage device having instructions for execution by a processor of the machine to perform:
detecting a position of a finger positioned proximate a touch screen of a hand held device, the touch screen a target available for selection via the finger;
comparing the detected position of the finger to a selection range; and
moving a target on the touch screen responsive to the comparison.

16. The computer readable storage device of example 15 wherein the selection range is a range corresponding to a range that is comfortable for a user to move their finger within.

17. The computer readable storage device of any of examples 15-16 wherein the method further comprises detecting a grip of the hand held device, and wherein the selection range is based on the detected grip.

18. The computer readable storage device of any of examples 15-17 wherein moving the target on the touch screen comprises:
recognizing that a finger is extending beyond the selection range based on the comparison;
identifying potential targets outside the selection range in a direction extending from a center of the selection range towards the detected position of the finger; and
moving a most likely target from the identified potential targets from outside the selection range to inside the selection range along the direction used to identify potential targets.

19. A hand held device comprising:
a case;
a storage device disposed within the case;
a touch screen supported by the case;
finger proximity sensors coupled to the case; and
a processor coupled to the storage device, the proximity sensors, and the touch screen, wherein the processor receives instructions from the storage device for execution by the processor to:
detect a position of a finger positioned proximate a touch screen of a hand held device, the touch screen having a target available for selection via the finger;
compare the detected position of the finger to a selection range; and
move a target on the touch screen responsive to the comparison.

20. The hand held device of example 19 wherein moving the target on the touch screen comprises:
recognizing that a finger is extending beyond the selection range based on the comparison;
identifying potential targets outside the selection range in a direction extending from a center of the selection range towards the detected position of the finger; and
moving a most likely target from the identified potential targets from outside the selection range to inside the selection range along the direction used to identify potential targets.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. A method comprising: detecting via a processor a position of a finger positioned proximate a touch screen of a hand held device, the touch screen having a target available for selection via the finger;
detecting via the processor a grip of the hand held device, and wherein a selection range is associated with the grip;
comparing the detected position of the finger to the selection range via the processor of the hand held device; and
moving a target on the touch screen via the processor of the hand held device responsive to the comparison such that the target is easily selectable without changing the grip, wherein moving the target on the touch screen comprises:
recognizing that a finger is extending beyond the selection range based on the comparison;
identifying potential targets outside the selection range in a direction extending from a center of the selection range towards the detected position of the finger; and
moving a most likely target from the identified potential targets from outside the selection range to inside the selection range along the direction used to identify potential targets,
wherein the most likely target is a target most often selected from the identified potential targets.

2. The method of claim 1, wherein the target is moved within the selection range.

3. The method of claim 1, wherein the selection range is a range corresponding to a range that is comfortable for a user to move their finger within.

4. The method of claim 1, wherein the selection range is associated with the grip via a selection range table of selection ranges associated with grips.

5. The method of claim 4, and further comprising selecting the selection range based on the detected grip from the selection range table in response to detecting a shift in grip pressure associated with difficulty reaching the target.

6. The method of claim 1, and further comprising moving multiple identified potential targets by shifting all content on the screen toward the finger.

7. The method of claim 1, wherein the targets comprise icons, wherein the most likely target comprises an icon most often selected from the identified potential targets, and wherein the most likely target is moved without moving other content on the screen and is drawn on top of other targets.

8. The method of claim 1, wherein the finger position is detected via capacitive sensors in the touch screen.

9. The method of claim 1, wherein the finger position is detected via cameras.

10. The method of claim 1, wherein the finger position is detected via pressure sensors.

11. The method of claim 1, wherein the finger position proximate the touch screen includes finger position touching the touch screen and finger position above the touch screen corresponding to a user using the finger to reach a target.

12. The method of claim 1, wherein the target comprises a user selectable icon.

13. A non-transitory machine readable storage device having instructions for execution by a processor of the machine to perform: detecting a position of a finger positioned proximate a touch screen of a hand held device, the touch screen a target available for selection via the finger;
detecting a grip of the hand held device, and wherein a selection range is associated with the grip;
comparing the detected position of the finger to the selection range; and moving a target on the touch screen responsive to the comparison such that the target is easily selectable without changing the grip, wherein moving the target on the touch screen comprises:
recognizing that a finger is extending beyond the selection range based on the comparison; identifying potential targets outside the selection range in a direction extending from a center of the selection range towards the detected position of the finger; and moving a most likely target from the identified potential targets from outside the selection range to inside the selection range along the direction used to identify potential targets,
wherein the most likely target is a target most often selected from the identified potential targets.

14. The non-transitory computer readable storage device of claim 13, wherein the selection range is a range corresponding to a range that is comfortable for a user to move their finger within.

15. The non-transitory computer readable storage device of claim 13, wherein the method further comprises detecting a grip of the hand held device, and wherein the selection range is based on the detected grip in response to detecting a shift in grip pressure associated with difficulty reaching the target.

16. A hand held device comprising: a case; a storage device disposed within the case; a touch screen supported by the case; finger proximity sensors coupled to the case; and
- a processor coupled to the storage device, the proximity sensors, and the touch screen, wherein the processor receives instructions from the storage device for execution by the processor to:
- detect a position of a finger positioned proximate a touch screen of a hand held device, the touch screen having a target available for selection via the finger;
- detect a grip of the hand held device, and wherein a selection range is associated with the grip; compare the detected position of the finger to the selection range; and
- move a target on the touch screen responsive to the comparison, wherein moving the target on the touch screen comprises:
- recognizing that a finger is extending beyond the selection range based on the comparison;
- identifying potential targets outside the selection range in a direction extending from a center of the selection range towards the detected position of the finger; and
- moving a most likely target from the identified potential targets from outside the selection range to inside the selection range along the direction used to identify potential targets,
- wherein the most likely target is a target most often selected from the identified potential targets.

* * * * *